US009246138B2

(12) United States Patent
Nishiyama

(10) Patent No.: US 9,246,138 B2
(45) Date of Patent: Jan. 26, 2016

(54) LIGHT-EMITTING PANEL, MANUFACTURING METHOD OF LIGHT-EMITTING PANEL, AND FILM FORMING SYSTEM

(71) Applicant: PANASONIC CORPORATION, Osaka (JP)

(72) Inventor: Seiji Nishiyama, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/579,019

(22) Filed: Dec. 22, 2014

(65) Prior Publication Data

US 2015/0104894 A1    Apr. 16, 2015

Related U.S. Application Data

(60) Division of application No. 13/738,046, filed on Jan. 10, 2013, now Pat. No. 8,952,365, which is a continuation of application No. PCT/JP2011/003249, filed on Jun. 8, 2011.

(51) Int. Cl.
*H01L 33/42* (2010.01)
*H01L 51/56* (2006.01)
(Continued)

(52) U.S. Cl.
CPC .............. *H01L 51/56* (2013.01); *C23C 14/083* (2013.01); *C23C 14/086* (2013.01); *C23C 14/35* (2013.01);
(Continued)

(58) Field of Classification Search
CPC . H01L 33/005; H01L 33/042; H01L 51/0008; H01L 51/56; H01L 51/5212; H01L 51/5228
USPC ...................................................... 438/48, 52
See application file for complete search history.

(56) References Cited

U.S. PATENT DOCUMENTS 5,443,922 A    8/1995    Nishizaki et al.
8,816,339 B2   8/2014    Kawamura et al.
(Continued)

FOREIGN PATENT DOCUMENTS

CN    101543136    9/2009
JP    5-163488     6/1993
(Continued)

OTHER PUBLICATIONS

International Search Report (ISA/210) for IA No. PCT/JP2011/003249.
(Continued)

*Primary Examiner* — Michael Lebentritt
(74) *Attorney, Agent, or Firm* — Greenblum & Bernstein, P.L.C.

(57) ABSTRACT

A light-emitting panel includes: a substrate and a light-emitting functional multilayer formed on the substrate, wherein the light-emitting functional multilayer including a first functional layer and a second functional layer, a thickness of part of the first functional layer positioned in a first light-emitting region is smaller than a thickness of part of the first functional layer positioned in a second light-emitting region, a thickness of part of the second functional layer positioned in the first light-emitting region is greater than a thickness of part of the second functional layer positioned in the second light-emitting region, and when the light-emitting functional multilayer is viewed in a layering direction, the first light-emitting region and the second light-emitting region are adjacent or distant from each other in a direction perpendicular to the layering direction, and each include a plurality of pixels that are each composed of a plurality of adjacent sub-pixels.

15 Claims, 14 Drawing Sheets

(51) Int. Cl.
*C23C 14/08* (2006.01)
*C23C 14/35* (2006.01)
*H01L 33/00* (2010.01)
*H01J 37/34* (2006.01)
*H01L 51/00* (2006.01)

(52) U.S. Cl.
CPC ........... *C23C 14/352* (2013.01); *H01J 37/3405* (2013.01); *H01J 37/3429* (2013.01); *H01J 37/3452* (2013.01); *H01L 33/005* (2013.01); *H01L 33/42* (2013.01); *H01L 51/001* (2013.01); *H01L 51/0008* (2013.01); *H01L 2251/558* (2013.01)

(56) References Cited

U.S. PATENT DOCUMENTS

| | | | |
|---|---|---|---|
| 8,884,276 | B2 | 11/2014 | Komatsu et al. |
| 8,952,365 | B2 * | 2/2015 | Nishiyama ............ C23C 14/083 257/40 |
| 2008/0286461 | A1 | 11/2008 | Noguchi et al. |
| 2009/0212692 | A1 | 8/2009 | Hasegawa |
| 2009/0224664 | A1 | 9/2009 | Yoshida et al. |
| 2009/0272999 | A1 | 11/2009 | Yoshida et al. |
| 2009/0284135 | A1 | 11/2009 | Yoshida et al. |
| 2012/0032207 | A1 | 2/2012 | Nishiyama et al. |
| 2012/0049175 | A1 | 3/2012 | Ono et al. |
| 2012/0091439 | A1 | 4/2012 | Nishiyama et al. |
| 2012/0112225 | A1 | 5/2012 | Le Bellac et al. |
| 2012/0119235 | A1 | 5/2012 | Nishiyama et al. |
| 2012/0268002 | A1 | 10/2012 | Osako et al. |
| 2012/0299116 | A1 | 11/2012 | Takeuchi et al. |
| 2013/0234129 | A1 | 9/2013 | Yamada et al. |
| 2014/0001457 | A1 | 1/2014 | Endo |
| 2014/0102877 | A1 | 4/2014 | Yamazaki |
| 2014/0127846 | A1 | 5/2014 | Yamada et al. |

FOREIGN PATENT DOCUMENTS

| | | |
|---|---|---|
| JP | 2002-367787 | 12/2002 |
| JP | 2006-283086 | 10/2006 |
| JP | 2006-292546 | 10/2006 |
| JP | 2007-262478 | 10/2007 |
| JP | 2007-297695 | 11/2007 |
| JP | 2008-285719 | 11/2008 |
| JP | 2009-114507 | 5/2009 |
| JP | 2009-149929 | 7/2009 |
| JP | 2009-231274 | 10/2009 |
| KR | 10-2007-0065097 | 6/2007 |
| WO | 2008/149498 | 12/2008 |
| WO | 2008/149499 | 12/2008 |

OTHER PUBLICATIONS

Office Action issued in China Counterpart Patent Appl. No. 201180036878.5, dated Jul. 3, 2015, along with an English translation thereof.

* cited by examiner

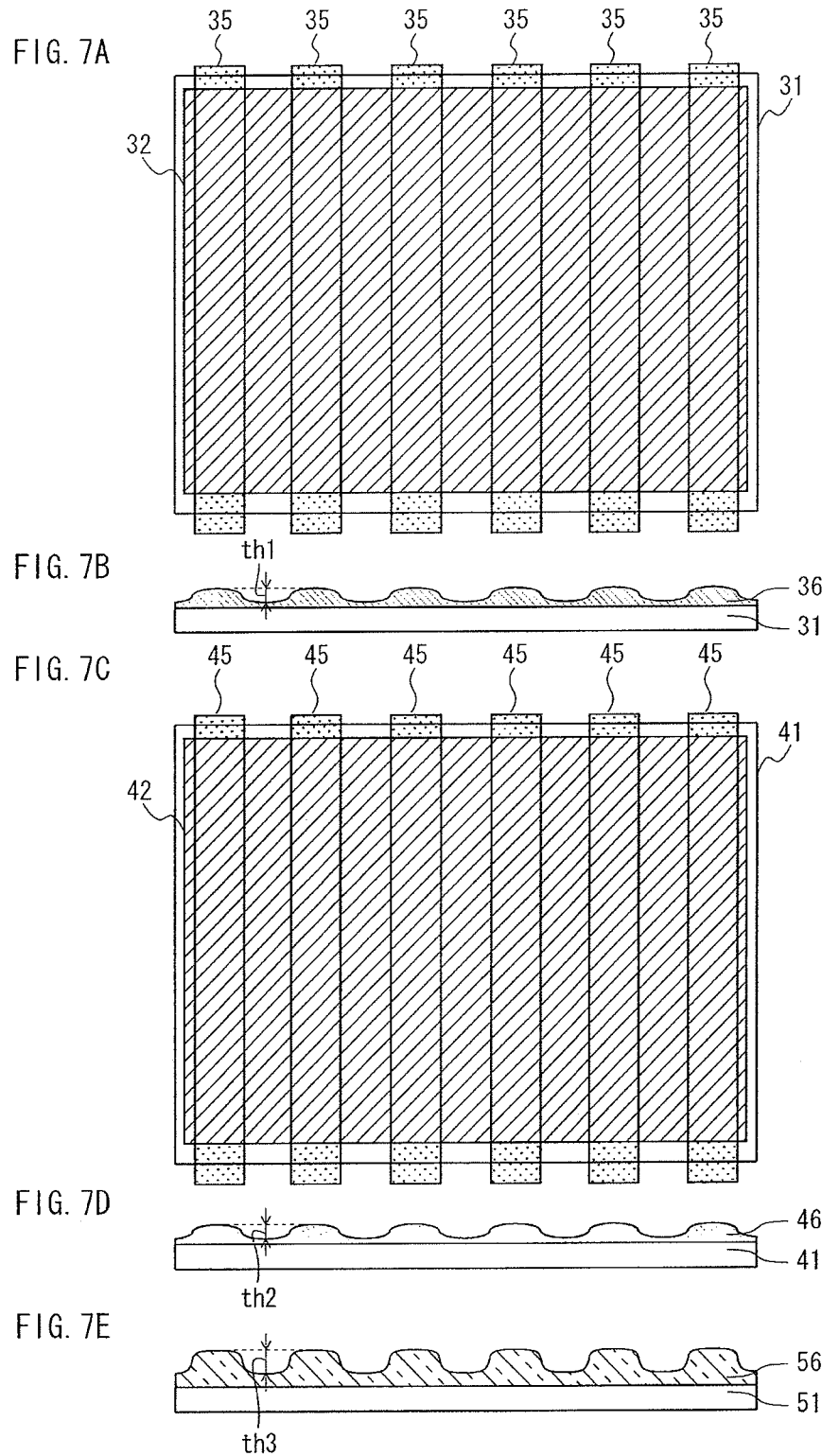

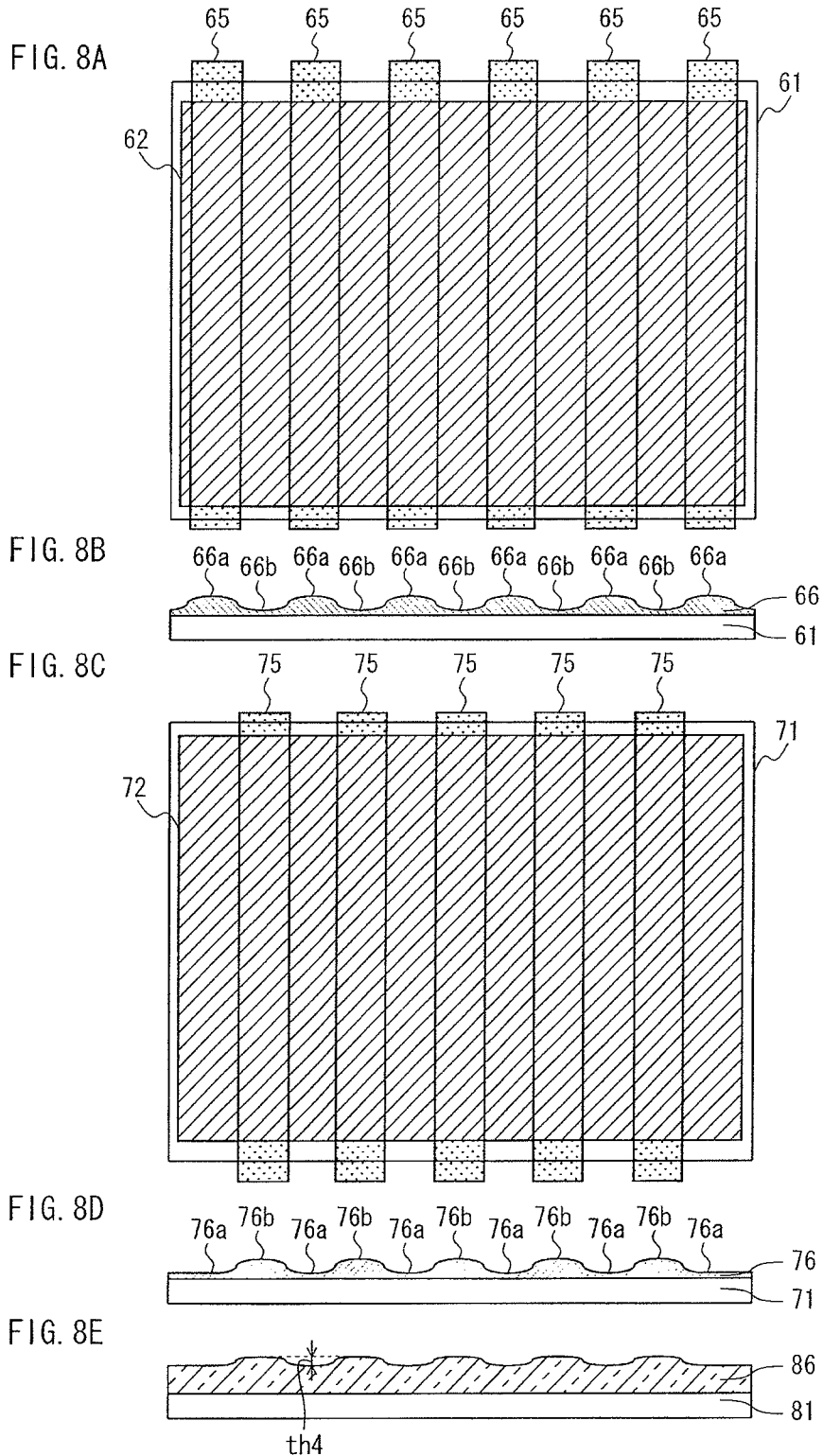

FIG. 9A
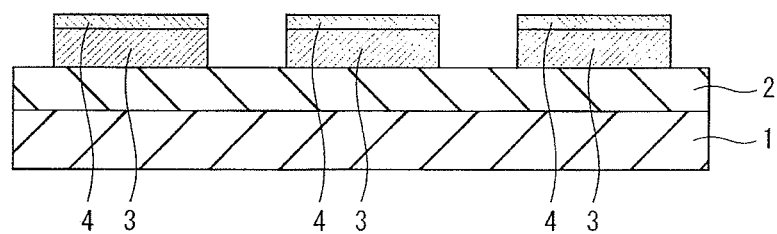
FIG. 9B
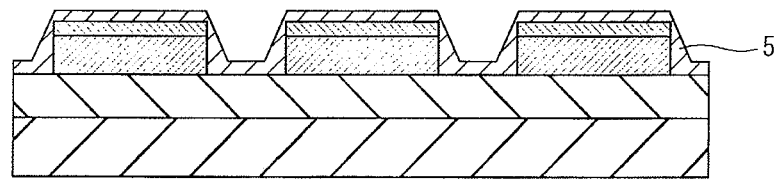
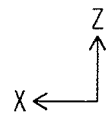

LIGHT-EMITTING PANEL, MANUFACTURING METHOD OF LIGHT-EMITTING PANEL, AND FILM FORMING SYSTEM

CROSS REFERENCE TO RELATED APPLICATION

The present application is a division of U.S. application Ser. No. 13/738,046, filed Jan. 10, 2013, which is a continuation application of PCT/JP2011/003249, filed Jun. 8, 2011, designating the United States of America, the disclosures of which incorporated herein by reference in their entireties.

TECHNICAL FIELD

The present disclosure relates to a light-emitting panel including a light-emitting functional multilayer constituted from a plurality of functional layers, a method of manufacturing of the light-emitting panel, and a film forming system.

DESCRIPTION OF THE RELATED ART

This type of light-emitting panel is expected as a next-generation panel for display and lighting, and has been researched and developed in recent years. The following describes the structure of a general light-emitting panel with use of an organic EL display panel as an example. The organic EL display panel has the structure in which an interlayer insulating film is formed on a thin film transistor (TFT), and an anode (pixel electrode) is formed on the interlayer insulating film for each sub-pixel. The anode is covered by a transparent conductive layer, and a bank is formed between each two adjacent anodes. Also, an organic light-emitting layer of a predetermined color is layered on each anode with the transparent conductive layer therebetween.

Between each anode and the organic light-emitting layer layered on the anode, one or two of a hole injection layer, a hole transport layer, and a hole injection/transport layer are formed as necessary.

Furthermore, a cathode (common electrode) is formed on each organic light-emitting layer all over the panel. Between the cathode and each organic light-emitting layer, one or two of an electron injection layer, an electron transport layer, and an electron injection/transport layer are formed as necessary.

Patent Literature 1 discloses a prior art of the multilayer structure of an organic EL display panel.

CITATION LIST

Patent Literature

[Patent Literature 1] Japanese Patent Application Publication No. 5-163488

SUMMARY

By the way, some of functional layers from an anode to a cathode (hereinafter, referred to also as "light-emitting functional multilayer") included in a light-emitting panel such as an organic EL display panel is formed with use of a vacuum film forming device such as a magnetron sputtering device and an evaporation device. The following describes a problem taking an example of a magnetron sputtering device as a vacuum film forming device, based on the assumption that a transparent conductive layer and a hole injection layer as layers included in a functional multilayer are formed.

The transparent conductive layer and the hole injection layer are each formed with use of a different magnetron sputtering device. On each of the magnetron sputtering devices, a target member is placed. On the reverse surface of the target member, a plurality of magnetrons are placed. For this reason, when the transparent conductive layer and the hole injection layer are formed, there occurs variation in thickness due to the magnetic field produced by the magnetrons. Here, the magnetron sputtering devices have the respective same placement positions of the magnetrons. Accordingly, the transparent conductive layer and the hole injection layer have the same uneven thickness. In the case where comparison is made between a first light-emitting region and a second light-emitting region of a light-emitting panel for example, the transparent conductive layer and the hole injection layer each have a greater thickness in the first light-emitting region than in the second light-emitting region. In other words, a thick part of the hole injection layer is layered on a thick part of the transparent conductive layer, and a thin part of the hole injection layer is layered on a thin part of the transparent conductive layer.

As a result, the entire light-emitting functional layer has a large difference in thickness between the first light-emitting region and the second light-emitting region.

This might cause the light-emitting panel to have an uneven luminance. This is considered to be due to a difference in optical distance and resistance value between the first light-emitting region and the second light-emitting region.

The above description has been given taking an example of a magnetron sputtering device as a vacuum film forming device. The similar problem occurs also in the case where film formation is performed with use of an evaporation device. This is because that the evaporation device has placed thereon evaporation sources instead of magnetrons, and an uneven film thickness occurs due to respective placement positions of the evaporation sources.

One non-limiting and exemplary embodiment provides a light-emitting panel including a light-emitting functional layer with an improved uneven thickness.

In one general aspect, the techniques disclosed here feature a light-emitting panel comprising: a substrate; and a light-emitting functional multilayer formed on the substrate, wherein the light-emitting functional multilayer including a first functional layer and a second functional layer, a thickness of part of the first functional layer positioned in a first light-emitting region is smaller than a thickness of part of the first functional layer positioned in a second light-emitting region, a thickness of part of the second functional layer positioned in the first light-emitting region is greater than a thickness of part of the second functional layer positioned in the second light-emitting region, and when the light-emitting functional multilayer is viewed in a layering direction thereof, the first light-emitting region and the second light-emitting region are adjacent or distant from each other in a direction perpendicular to the layering direction, and each include a plurality of pixels that are each composed of a plurality of adjacent sub-pixels.

According to the light-emitting panel relating to the one aspect of the present invention, the thickness of the part of the first functional layer positioned in the first light-emitting region is smaller than the thickness of the part of the first functional layer positioned in the second light-emitting region, and the thickness of the part of the second functional layer positioned in the first light-emitting region is greater than the thickness of the part of the second functional layer positioned in the second light-emitting region. That is, the first functional layer and the second functional layer differ in thickness distribution from each other.

Therefore, according to the light-emitting panel relating to the one aspect of the present invention, even though the first functional layer and the second functional layer each have a thick part and a thin part, it is possible to reduce the difference in thickness between the first light-emitting region and the second light-emitting region, compared with the case where the first functional layer and the functional layer have the same thickness distribution.

The uneven thickness of the light-emitting panel is improved, thereby improving the uneven luminance of the light-emitting panel.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed and need not all be provided in order to obtain one or more of the same.

BRIEF DESCRIPTION OF DRAWINGS

FIG. 7A schematically shows the placement relationship among a substrate 31, a target member 32, and a plurality of magnetrons 35 in the case where a first magnetron sputtering device is used, FIG. 7B schematically shows a transparent conductive layer 36 formed on the substrate 31 by the first magnetron sputtering device, FIG. 7C schematically shows the placement relationship among a substrate 41, a target member 42, and a plurality of magnetrons 45 in the case where a second magnetron sputtering device is used, FIG. 7D schematically shows a hole injection layer 46 formed on the substrate 41 by the second magnetron sputtering device, and FIG. 7E schematically shows a multilayered film 56.

FIG. 8A schematically shows the placement relationship among a substrate 61, a target member 62, and a plurality of magnetrons 65 in the case where the first magnetron sputtering device is used, FIG. 8B schematically shows a transparent conductive layer 66 formed on the substrate 61 by the first magnetron sputtering device, FIG. 8C schematically shows the placement relationship among a substrate 71, a target member 72, and a plurality of magnetrons 75 in the case where the second magnetron sputtering device is used, FIG. 8D schematically shows a hole injection layer 76 formed on the substrate 71 by the second magnetron sputtering device, and FIG. 8E schematically shows a multilayered film 86.

FIG. 9A and FIG. 9B show an example of a manufacturing process of the display panel 105.

DETAILED DESCRIPTION

Embodiments

Figure 1A:
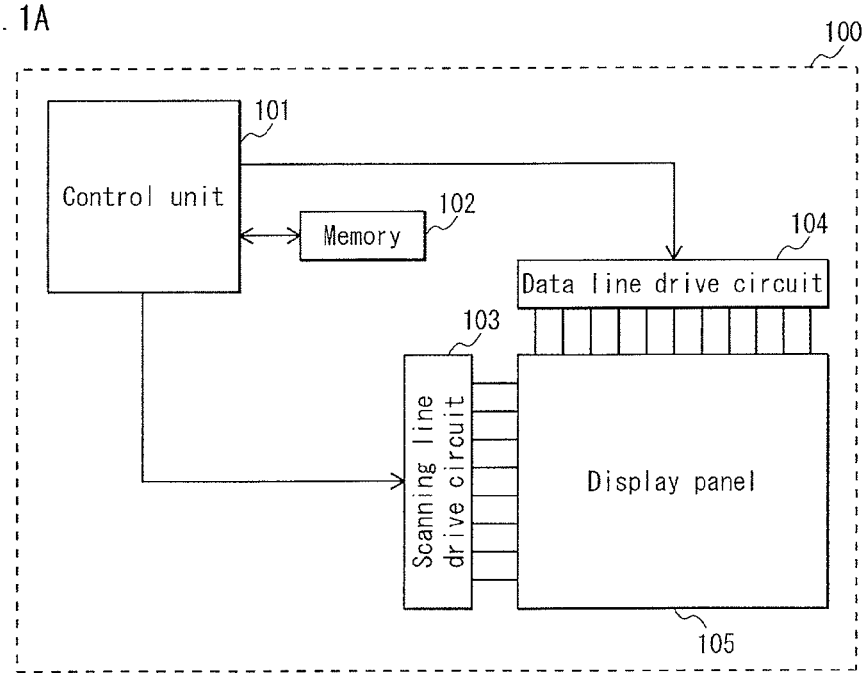
FIG. 1A is a block diagram showing the electrical structure of a display device 100 relating to Embodiment 1 of the present invention.

A light-emitting panel that is an exemplary aspect of the present invention is a light-emitting panel comprising: a substrate; and a light-emitting functional multilayer formed on the substrate, wherein the light-emitting functional multilayer including a first functional layer and a second functional layer, a thickness of part of the first functional layer positioned in a first light-emitting region is smaller than a thickness of part of the first functional layer positioned in a second light-emitting region, a thickness of part of the second functional layer positioned in the first light-emitting region is greater than a thickness of part of the second functional layer positioned in the second light-emitting region, and when the light-emitting functional multilayer is viewed in a layering direction thereof, the first light-emitting region and the second light-emitting region are adjacent or distant from each other in a direction perpendicular to the layering direction, and each include a plurality of pixels that are each composed of a plurality of adjacent sub-pixels.

According to the light-emitting panel relating to one aspect of the present invention, the thickness of the part of the first functional layer positioned in the first light-emitting region is smaller than the thickness of the part of the first functional layer positioned in the second light-emitting region, and the thickness of the part of the second functional layer positioned in the first light-emitting region is greater than the thickness of the part of the second functional layer positioned in the second light-emitting region. That is, the first functional layer and the second functional layer differ in thickness distribution from each other.

Therefore, according to the light-emitting panel relating to the one aspect of the present invention, even though the first functional layer and the second functional layer each have a thick part and a thin part, it is possible to reduce the difference in film thickness between the first light-emitting region and the second light-emitting region, compared with the case where the first functional layer and the functional layer have the same thickness distribution.

The uneven thickness of the light-emitting panel is improved, thereby improving the uneven luminance.

Here, according to another aspect of the present invention, the first functional layer and the second functional layer each may be formed by a vacuum film forming method.

Here, according to another aspect of the present invention, the first functional layer and the second functional layer may be adjacent each other in the layering direction.

Here, according to another aspect of the present invention, the light-emitting functional multilayer may further include an anode and a cathode facing each other with the first functional layer and the second functional layer therebetween, the first functional layer may be a transparent conductive layer layered on the anode, and the second functional layer may be a charge injection layer layered on the transparent conductive layer.

Here, according to another aspect of the present invention, the first functional layer may be formed from ITO or IZO, and the second functional layer may be formed from oxidized metal.

Here, according to another aspect of the present invention, the light-emitting functional multilayer may further include a third functional layer, and a thickness of part of the third functional layer positioned in the first light-emitting region may be greater than a thickness of part of the third functional layer positioned in the second light-emitting region.

Here, according to another aspect of the present invention, the third functional layer may be an anode, the light-emitting functional multilayer may further include a cathode facing the anode with the first functional layer and the second functional layer therebetween, the first functional layer may be a transparent conductive layer layered on the anode, and the second functional layer may be a charge injection layer layered on the transparent conductive layer.

Here, according to another aspect of the present invention, the third functional layer may be formed from aluminum, silver, alloy of aluminum, or alloy of silver.

Here, according to another aspect of the present invention, the third functional layer may be a cathode, the light-emitting functional multilayer may further include an anode facing the cathode with the first functional layer and the second functional layer therebetween, the first functional layer may be a transparent conductive layer layered on the anode, and the second functional layer may be a charge injection layer layered on the transparent conductive layer.

Here, a manufacturing method of a light-emitting panel that is another aspect of the present invention is a manufacturing method of a light-emitting panel including a substrate and a light-emitting functional multilayer that is formed on the substrate and includes a plurality of functional layers, the manufacturing method comprising: forming the first functional layer by a first film forming device; and forming the second functional layer by a second film forming device, wherein a thickness of part of the first functional layer positioned in a first light-emitting region is smaller than a thickness of part of the first functional layer positioned in a second light-emitting region a thickness of part of the second functional layer positioned in the first light-emitting region is greater than a thickness of part of the second functional layer positioned in the second light-emitting region, and when the light-emitting functional multilayer is viewed in a layering direction thereof, the first light-emitting region and the second light-emitting region are adjacent or distant from each other in a direction perpendicular to the layering direction, and each include a plurality of pixels that are each composed of a plurality of adjacent sub-pixels.

Here, according to another aspect of the present invention, the first film forming device may be a first magnetron sputtering device, and the second film forming device may be a second magnetron sputtering device.

Here, according to another aspect of the present invention, the first magnetron sputtering device may comprise: a first target member; a first target member holder that holds the first target member placed on a first surface thereof; and a plurality of first magnetrons placed on a second surface of the first target member holder that is opposite the first surface of the first target member holder, the second magnetron sputtering device may comprises: a second target member; a second target member holder that holds the second target member placed on a first surface thereof; and a plurality of second magnetrons placed on a second surface of the second target member holder that is opposite the first surface of the second target member holder, the substrate may be placed facing the first target member in the first magnetron sputtering device, and then the substrate may be placed facing the second target member in the second magnetron sputtering device, and respective positions of the first magnetrons placed facing the substrate may differ from respective positions of the second magnetrons placed facing the substrate.

According to the method of manufacturing of the light-emitting panel relating to the other aspect, the first magnetron sputtering device and the second magnetron sputtering device differ in respective placement positions of magnetrons from each other. Accordingly, the first functional layer and the second functional layer differ in thickness distribution from each other. Therefore, it is possible to improve an uneven thickness of the multilayered film including the first functional layer and the second functional layer, compared with the case where the first functional layer and the second functional layer have the same thickness distribution.

Here, according to another aspect of the present invention, the first magnetrons may be equally spaced with a first spacing, the second magnetrons may be equally spaced with a second spacing, and the first spacing and the second spacing may be equal to each other.

Here, according to another aspect of the present invention, the first functional layer and the second functional layer may be adjacent each other in the layering direction.

Here, according to another aspect of the present invention, the light-emitting functional multilayer may further include a third functional layer, the manufacturing method may further comprise forming the third functional layer by a third magnetron sputtering device, and a thickness of part of the third functional layer positioned in the first light-emitting region may be greater than a thickness of part of the third functional layer positioned in the second light-emitting region.

Here, according to another aspect of the present invention, the third magnetron sputtering device may comprise: a third target member; a third target member holder that holds the third target member placed on a first surface thereof; and a plurality of third magnetrons placed on a second surface of the first target member holder that is opposite the first surface of the third target member holder, and respective positions of the third magnetrons placed facing the substrate may differ from both the respective positions of the first magnetrons placed facing the substrate and the respective positions of the second magnetrons placed facing the substrate.

According to the method of manufacturing of the light-emitting panel relating to the other aspect, the first magnetron sputtering device, the second magnetron sputtering device, the third magnetron sputtering device differ in respective placement positions of magnetrons from one another. Accordingly, the first functional layer, the second functional layer, and the third functional layer differ in thickness distribution from one another. Therefore, it is possible to improve an uneven thickness of the multilayered film including the first functional layer, the second functional layer, and the third functional layer, compared with the case where the first functional layer, the second functional layer, and the third functional layer have the same thickness distribution.

Here, according to another aspect of the present invention, the first film forming device may be a first evaporation device, and the second film forming device may be a second evaporation device.

Here, according to another aspect of the present invention, the first evaporation device may comprise a plurality of first evaporation sources, the second evaporation device may comprise a plurality of second evaporation sources, the substrate may be placed facing the first evaporation sources in the first evaporation device, and then the substrate may be placed facing the second evaporation sources in the second evaporation, and respective positions of the first evaporation sources placed facing the substrate may differ from respective positions of the second evaporation sources placed facing the substrate.

According to the method of manufacturing of the light-emitting panel relating to the other aspect, the first evaporation device and the second evaporation device differ in respective placement positions of evaporation sources from each other. Accordingly, the first functional layer and the second functional layer differ in thickness distribution from each other. Therefore, it is possible to improve an uneven thickness of the multilayered film including the first functional layer and the second functional layer, compared with the case where the first functional layer and the second functional layer have the same thickness distribution.

Here, according to another aspect of the present invention, the first evaporation sources may be equally spaced with a first spacing, the second evaporation sources may be equally spaced with a second spacing, and the first spacing and the second spacing may be equal to each other.

Here, according to another aspect of the present invention, the first functional layer and the second functional layer may be adjacent each other in the layering direction.

Here, according to another aspect of the present invention, the light-emitting functional multilayer may further include a third functional layer, the manufacturing method may further comprise forming the third functional layer by a third evaporation device, and a thickness of part of the third functional layer positioned in the first light-emitting region may be greater than a thickness of part of the third functional layer positioned in the second light-emitting region.

Here, according to another aspect of the present invention, the third evaporation device may comprise a plurality of third evaporation sources, respective positions of the third evaporation sources placed facing the substrate may differ from both the respective positions of the first evaporation sources placed facing the substrate and the respective positions of the second evaporation sources placed facing the substrate.

According to the method of manufacturing of the light-emitting panel relating to the other aspect, the first evaporation device, the second evaporation device, and the third evaporation device differ in respective placement positions of evaporation sources from one another. Accordingly, the first functional layer, the second functional layer, and the third functional layer differ in thickness distribution from one another. Therefore, it is possible to improve an uneven thickness of a multilayered film including the first functional layer, the second functional layer, and the third functional layer, compared with the case where the first functional layer, the second functional layer, and the third functional layer have the same thickness distribution.

A film forming system for use in manufacturing a light-emitting panel that is an exemplary aspect of the present invention is a film forming system for use in manufacturing a light-emitting panel including a substrate and a light-emitting functional multilayer that is formed on the substrate and includes a plurality of functional layers including a first functional layer and a second functional layer, the film forming system comprising a first magnetron sputtering device for forming the first functional layer and a second magnetron sputtering device for forming the second functional layer, wherein the first magnetron sputtering device comprises: a first target member; a first target member holder that holds the first target member placed on a first surface thereof; and a plurality of first magnetrons placed on a second surface of the first target member holder that is opposite the first surface of the first target member holder, the second magnetron sputtering device comprises: a second target member; a second target member holder that holds the second target member placed on a first surface thereof; and a plurality of second magnetrons placed on a second surface of the second target member holder that is opposite the first surface of the second target member holder, the substrate is placed facing the first target member in the first magnetron sputtering device, and then the substrate is placed facing the second target member in the second magnetron sputtering device, and respective positions of the first magnetrons placed facing the substrate differ from respective positions of the second magnetrons placed facing the substrate.

A film forming system for use in manufacturing a light-emitting panel that is an exemplary aspect of the present invention is a film forming system for use in manufacturing a light-emitting panel including a substrate and a light-emitting functional multilayer that is formed on the substrate and includes a plurality of functional layers including a first functional layer and a second functional layer, the film forming system comprising a first evaporation device for forming the first functional layer and a second evaporation device for forming the second functional layer, wherein the first evaporation device comprises a plurality of first evaporation sources, the second evaporation device comprises a plurality of second evaporation sources, the substrate is placed facing the first evaporation sources in the first evaporation device, and then the substrate is placed facing the second evaporation sources in the second evaporation, and respective positions of the first evaporation sources placed facing the substrate differ from respective positions of the second evaporation sources placed facing the substrate.

Embodiment 1

The following describes a display panel as an example of a light-emitting panel.

<Outline of Display Device 100>

FIG. 1A is a block diagram showing the electrical structure of a display device 100 including a display panel 105 relating to Embodiment 1 of the present invention. As shown in FIG. 1A, the display device 100 includes a control unit 101, a memory 102, a scanning line drive circuit 103, a data line drive circuit 104, and the display panel 105 in which pixel circuits are arranged in rows and columns. The display panel 105 is, for example, an electroluminescent (hereinafter, "EL") display panel or an organic EL display panel.

Figure 1B:
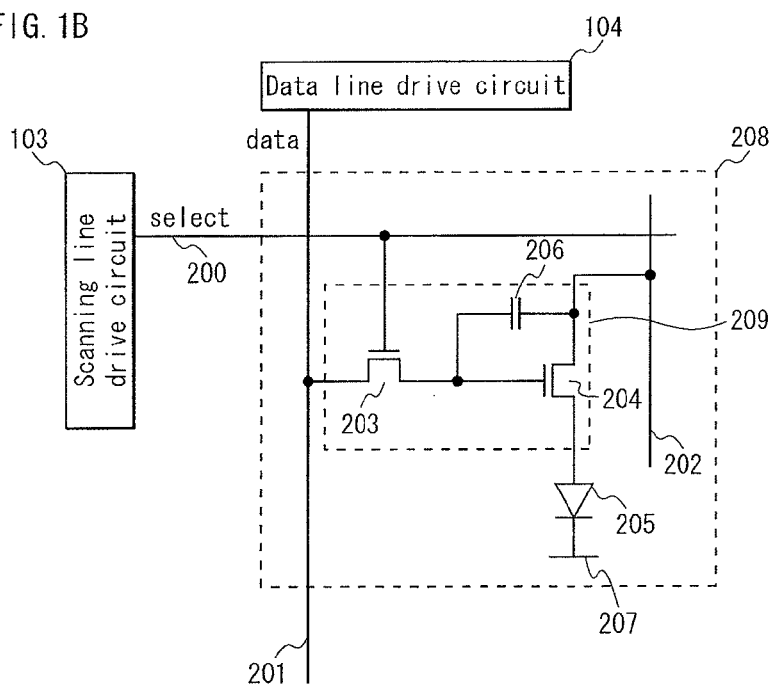
FIG. 1B shows the structure of one of pixel circuits of a display panel 105 and connection between the pixel circuit and a peripheral circuit thereof.

FIG. 1B shows the structure of one of the pixel circuits of the display panel 105 and connection between the pixel circuit and a peripheral circuit thereof. As shown in FIG. 1B, a pixel circuit 208 includes a gate line 200, a data line 201, a power line 202, a switching transistor 203, a drive transistor 204, an anode 205, a retention volume 206, and a cathode 207. The switching transistor 203 and the drive transistor 204 are each formed from a thin-film transistor element.

The peripheral circuit includes the scanning line drive circuit 103 and the data line drive circuit 104. Also, the switching transistor 203, the drive transistor 204, and the retention volume 206 constitute a drive part 209.

Signal voltage supplied from the data line drive circuit 104 is applied to a gate terminal of the drive transistor 204 via the switching transistor 203. The drive transistor 204 supplies current depending on data voltage of the signal voltage to source-drain terminals. This current flows to the anode 205, and luminance depending on the current is exhibited.

<Outline of Structure of Display Panel 105>

Figure 2:
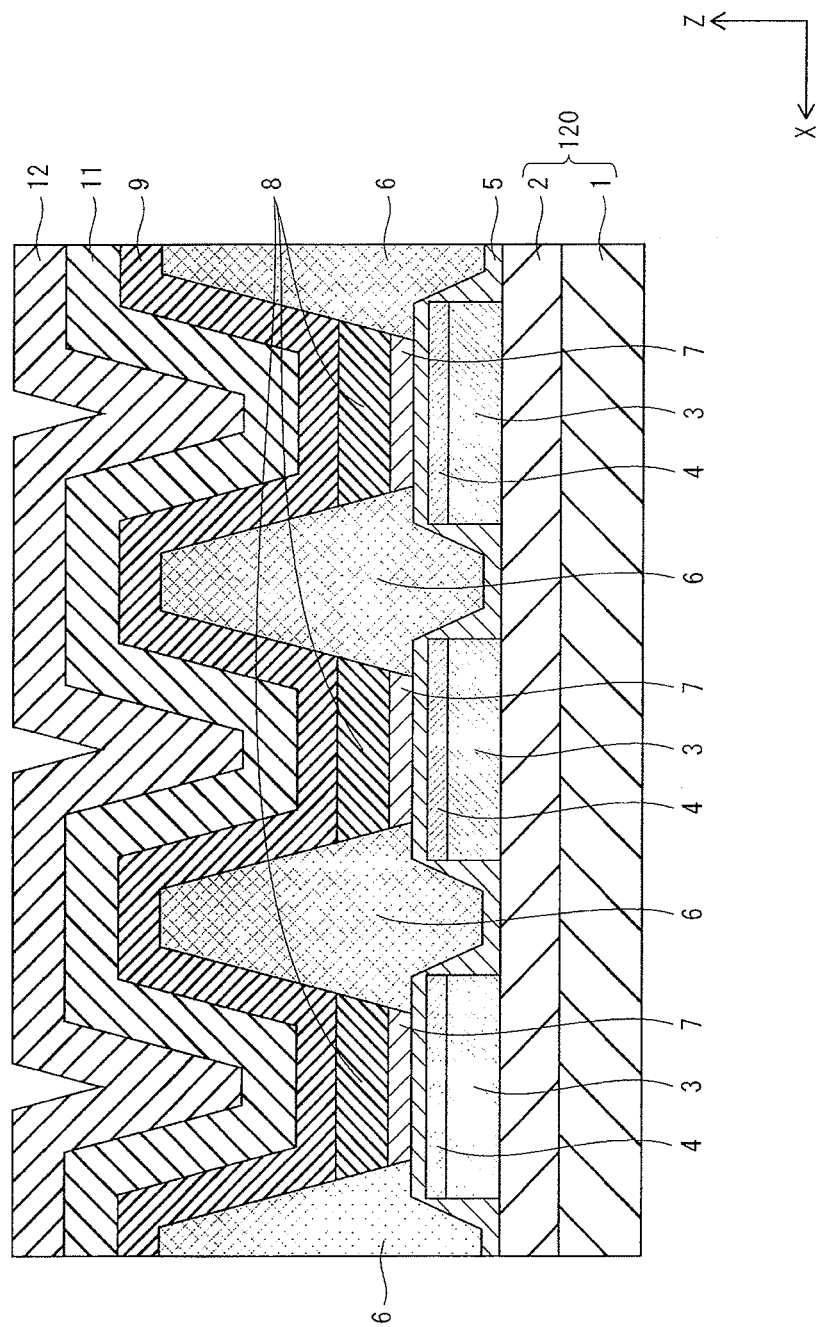
FIG. 2 is a partial cross-sectional view schematically showing a main part of the display panel 105.

FIG. 2 is a partial cross-sectional view schematically showing a main part of the display panel 105. As shown in FIG. 2, an interlayer insulating film 2 is formed on a TFT substrate 1, and anodes 3 are formed on the interlayer insulating film 2 in units of sub-pixels in rows and columns. In the present Description, the TFT substrate 1 on which the interlayer insulating film 2 is formed is defined as "substrate 120". Each three adjacent sub-pixels in the X-axis direction constitute one pixel.

Transparent conductive layers 4 are formed on the anodes 3 in one-to-one correspondence. A hole injection layer 5 is formed on the interlayer insulating film 2 so as to cover the transparent conductive layers 4.

A bank 6 is formed on a region on the hole injection layer 5 corresponding in position to an interval between each two adjacent anodes 3. A hole transport layer 7 is formed on a region on the hole injection layer 5 defined by each two adjacent banks 6. A light-emitting layer 8 of a predetermined color is layered on the hole transport layer 7.

Furthermore, on the light-emitting layers 8, an electron transport layer 9, a cathode 11, and a passivation layer 12 are formed in this order such that the electron transport layer 9, the cathode 11, and the passivation layer 12 are each continuous beyond the respective regions defined by the bank 6.

<Case where Transparent Conductive Layer and Hole Injection Layer have Same Thickness Distribution>

Before description on characteristics of the display panel 105, the following description is given on, as a comparison target of the display panel 105, a display panel having the structure in which two layers included in a functional multilayer have the same thickness distribution. The two layers included in the functional multilayer here are, for example, a transparent conductive layer and a hole injection layer.

Figure 3:
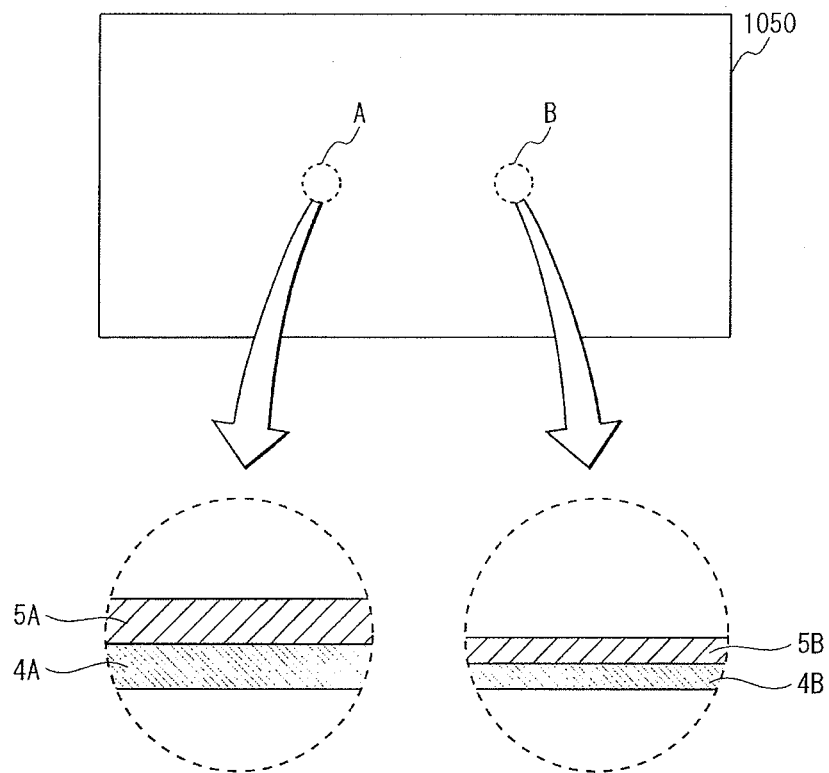
FIG. 3 schematically shows the respective thicknesses of a transparent conductive layer and a hole injection layer in each of micro regions A and B of a display panel 1050.

FIG. 3 schematically shows the respective thicknesses of a transparent conductive layer and a hole injection layer in each of micro regions A and B of a display panel 1050. When a light-emitting functional multilayer including the transparent conductive layer and the hole injection layer is viewed in the layering direction thereof, the micro regions A and B are distant from each other in a direction perpendicular to the layering direction. The micro regions A and B are each a region composed of a plurality of pixels, for example.

The transparent conductive layer and the hole injection layer have the same thickness distribution. Accordingly, as shown in FIG. 3, the thickness of a part 4A of the transparent conductive layer positioned in the micro region A is greater than the thickness of a part 4B of the transparent conductive layer positioned in the micro region B. Similarly, the thickness of a part 5A of the hole injection layer positioned in the micro region A is greater than the thickness of a part 5B of the hole injection layer positioned in the micro region B.

Since the transparent conductive layer and the hole injection layer, which have the same thickness distribution, are layered, there occurs a greater difference in thickness between the micro regions A and B compared with the case where a functional layer having a single-layer structure is employed.

Next, the present inventors made an experiment to examine what influence is exercised on the luminance due to the layering of the transparent conductive layer and the hole injection layer, which have the same thickness distribution. The experiment was made with use of a glass substrate on which only two layers of a transparent conductive layer and a hole injection layer are layered. Indium zinc oxide (IZO) and tungsten oxide (WOx) are used here for the transparent conductive layer and the hole injection layer, respectively.

Figure 4A:
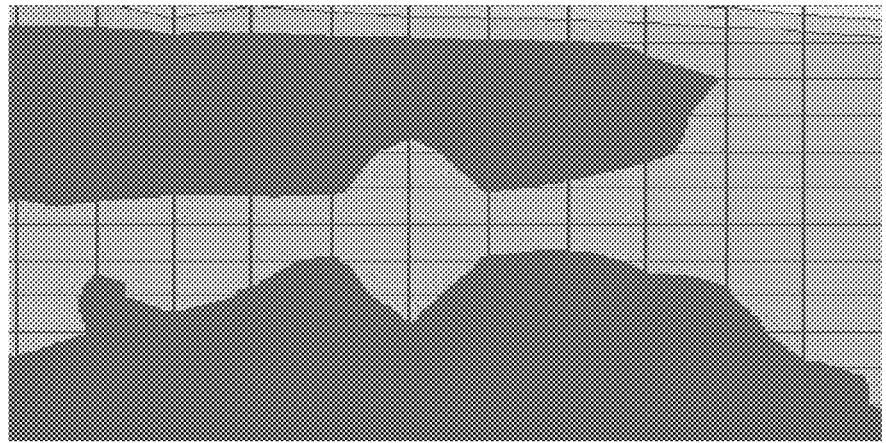
FIG. 4A shows the thickness distribution of the transparent conductive layer.
Figure 4B:
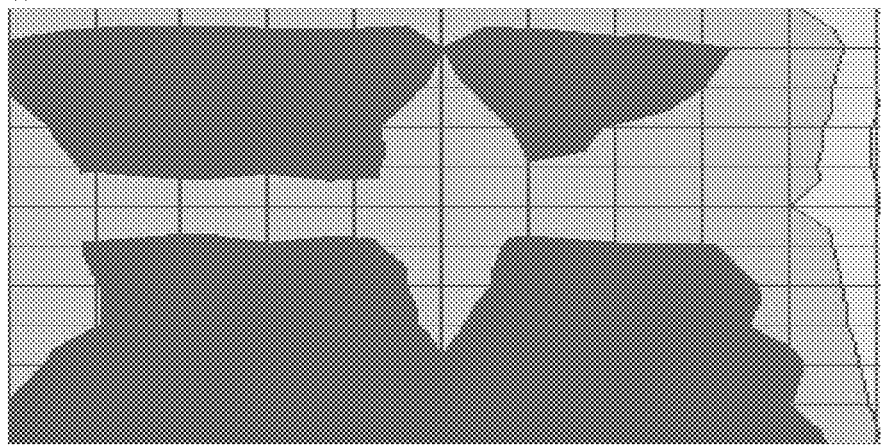
FIG. 4B shows the thickness distribution of the hole injection layer.
Figure 4C:
FIG. 4C shows the luminance distribution of a multilayered film including the transparent conductive layer and the hole injection layer.

FIG. 4A to FIG. 4C show the thickness distributions of the transparent conductive layer, the hole injection layer, and a multilayered film including the transparent conductive layer and the hole injection layer, respectively. Again, FIG. 4A shows the thickness distribution of the transparent conductive layer, and FIG. 4B shows the thickness distribution of the hole injection layer. As shown in FIG. 4A and FIG. 4B, the respective thicknesses of the transparent conductive layer and the hole injection layer are uneven. In FIG. 4A and FIG. 4B, dark parts indicate respective thick parts of the transparent conductive layer and the hole injection layer.

Also, comparison of FIG. 4A and FIG. 4B shows that the transparent conductive layer and the hole injection layer have the same thickness distribution.

FIG. 4C shows the luminance distribution of the multilayered film including the transparent conductive layer and the hole injection layer. As shown in FIG. 4C, the multilayered film, which includes the transparent conductive layer and the hole injection layer, has an uneven luminance depending on the uneven thickness. This is considered to be due to the difference in optical distance and resistance value between the micro regions A and B. Therefore, it is considered that a greater uneven thickness of the multilayered film causes a greater uneven luminance of the multilayered film.

As described above, an uneven luminance occurs due to layering of the transparent conductive layer and the hole injection layer, which have the same thickness distribution, that is, due to an uneven thickness of a surface of the multilayered film including the transparent conductive layer and the hole injection layer.

<Case where Transparent Conductive Layer and Hole Injection Layer Differ in Thickness Distribution from Each Other>

Next, the characteristics of the display panel 105 are described. The display panel 105 has the structure in which a transparent conductive layer and a hole injection layer differ in thickness distribution from each other.

Figure 5:
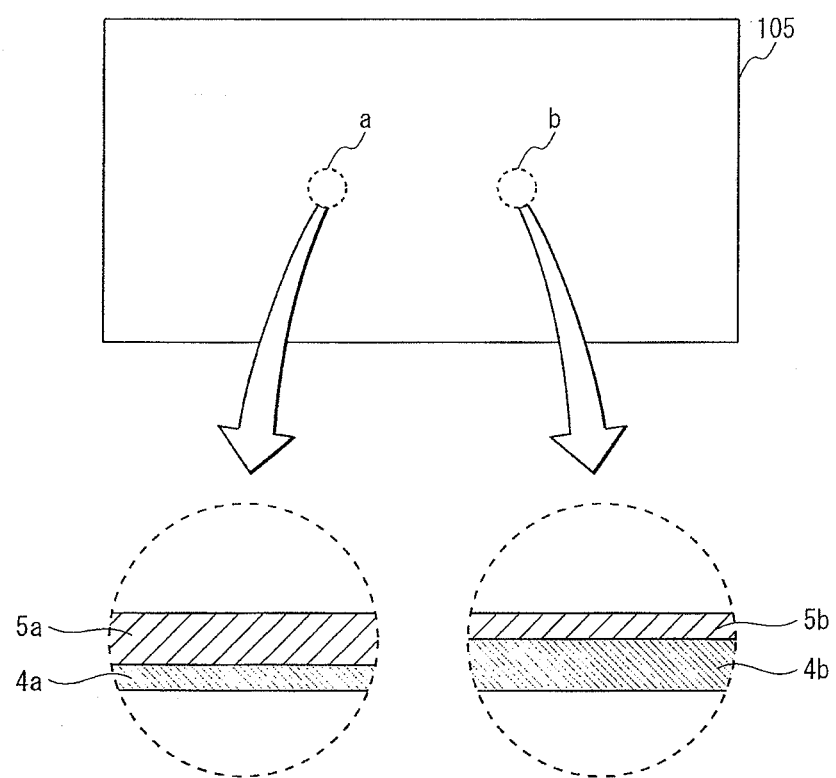
FIG. 5 schematically shows the respective thicknesses of a transparent conductive layer and a hole injection layer in each of micro regions a and b of the display panel 105.

FIG. 5 schematically shows the respective thicknesses of a transparent conductive layer 4 and a hole injection layer 5 in each of micro regions a and b of the display panel 105. When a light-emitting functional multilayer including the transparent conductive layer 4 and the hole injection layer 5 is viewed in the layering direction thereof, the micro regions a and b are distant from each other in a direction perpendicular to the layering direction. The micro regions a and b are each a region composed of a plurality of pixels, for example. As shown in FIG. 5, while the thickness of a part 5a of the hole injection layer 5 positioned in the micro region a is greater than the thickness of a part 5b of the hole injection layer 5 positioned in the micro region b, the thickness of a part 4a of the transparent conductive layer 4 positioned in the micro region a is smaller than the thickness of a part 4b of the transparent conductive layer 4 positioned in the micro region b.

In other words, the transparent conductive layer 4 and the hole injection layer 5 differ in thickness distribution from each other. While the thick part 5a of the hole injection layer 5 is layered on the thin part 4a of the transparent conductive layer 4, the thin part 5b of the hole injection layer 5 is layered on the thick part 4b of the transparent conductive layer 4.

As described above, it is true that the display panel 105 has the structure in which the transparent conductive layer 4 and the hole injection layer 5 each have a thick part and a thin part. However, the display panel 105 has an improved uneven thickness of the multilayered film including the transparent conductive layer 4 and the hole injection layer 5 in the micro regions a and b, compared with the case where the transparent conductive layer 4 and the hole injection layer 5 have the same thickness distribution. This improves the uneven luminance of the display panel 105.

<Structure of Compositional Elements of Display Panel 105>

The TFT substrate 1 has the structure in which TFT, a wiring material, a passivation film (not illustrated) for covering the TFT, and so on are formed on a main body of the TFT substrate 1 formed from an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina. The main body of the TFT substrate 1 may be an organic resin film.

The interlayer insulating film 2 is provided in order to planarize the uneven surface of the TFT substrate 1, and is formed from an insulating material such as polyimide resin and acrylic resin.

The anodes 3 are each formed from aluminum (Al) or aluminum alloy. Alternatively, the anodes 3 each may be formed from silver (Ag), alloy of silver, palladium, and copper (APC), alloy of silver, rubidium, and gold (ARA), alloy of molybdenum and chromium (MoCr), alloy of nickel and chromium (NiCr), or the like.

The transparent conductive layers 4 each function as a protective layer for preventing natural oxidation of the anode 3 during the manufacturing process. The material for the transparent conductive layer 4 only needs to be formed from a conductive material sufficiently translucent with respect to light emitted by the light-emitting layer 8. For example, the transparent conductive layer 4 is for example formed from Indium Tin Oxide (ITO) or IZO that achieve an excellent conductivity under the conditions that film formation is made at a room temperature.

The hole injection layer 5 has a function of injecting holes into the light-emitting layer 8. The hole injection layer 5 is formed from a metal oxide containing an oxide of a transition metal such as WOx, molybdenum oxide (MoOx), and molybdenum-tungsten oxide ($Mo_xW_yO_z$).

The banks 6 are each formed from an organic material such as resin, and has insulating properties. The organic material is, for example, acrylic resin, polyimide resin, or novolac-type phenolic resin. The bank 6 desirably has an organic solvent resistance. Furthermore, since the bank 6 sometimes undergoes etching processing, baking processing, and so on, the bank 6 is desirably formed from a highly resistant material in order to avoid excessive distortion, transformation due to such processing.

The hole transport layer 7 is for example formed from any of components disclosed in Japanese Patent Application Publication No. 5-163488 including a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, and a tetraphenylbenzene derivative. In particular, a porphyrin compound, as well as an aromatic tertiary amine compound and styrylamine compound, are desirable.

In the case where the light-emitting layer 8 is an organic light-emitting layer, the light-emitting layer 8 is desirably formed from polyfluorene, polyphenylenevinylene, polyacetylene, polyphenylene, polyparaphenyleneethylene, poly3-hexylthiophene, or a high-polymer material of any of respective derivatives of these components. Alternatively, the light-emitting layer 8, which is an organic light-emitting layer, is desirably formed from a fluorescent material among components disclosed in Japanese Patent Application Publication No. H5-163488 including an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and aza-quinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanornethylene pyran compound, dicyanornethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2-bipyridine compound, complex of Schiff base and group-3 metal, metal complex of oxine, and rare earth metal complex.

The electron transport layer 9 is for example formed from any of components disclosed in Japanese Patent Application Publication No. H5-163488 including a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative.

Note that, in order to further improve electron injection characteristics, the above material for the electron transport layer 9 may be doped with alkali metal such as Na or alkaline-earth metal such as Ba and Ca.

The cathode 11 is for example formed from ITO or IZO.

The passivation layer 12 has a function of preventing the light-emitting layer 8 from being exposed to moisture and air. The passivation layer 12 is for example formed from silicon oxide (SiO), silicon nitride (SiN), silicon oxynitride (SiON), silicon carbide (SiC) carbon-doped silicon oxide (SiOC), aluminum nitride (AlN), or aluminum oxide ($Al_2O_3$).

<Structure of Film Forming System>

A film forming system for example includes a plurality of vacuum film forming devices. The following describes the vacuum film forming devices, with use of a magnetron sputtering device as an example.

Figure 6A:
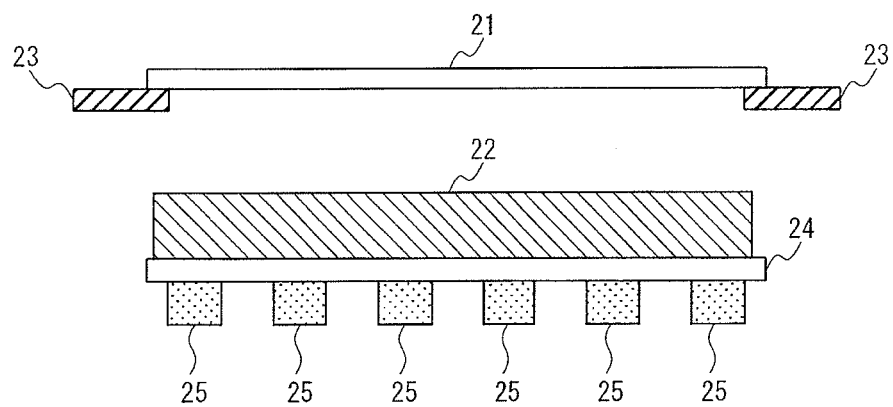
FIG. 6A shows the internal structure of a magnetron sputtering device, FIG. 6B schematically shows the placement relationship among a substrate 21, a target member 22, and a plurality of magnetrons 25, and FIG. 6C schematically shows a functional layer 26 formed on the substrate 21.

Firstly, a simple description is given on the structure of the magnetron sputtering device. FIG. 6A shows the internal structure of the magnetron sputtering device. Inside the magnetron sputtering device (not illustrated), a substrate 21 and a target member 22 are provided so as to face each other, as shown in FIG. 6A. The substrate 21 is held by substrate holders 23. The target member 22 is held by a target member holder 24. On a surface of the target member holder 24 that is opposite a surface on which the target member 22 is held, a plurality of magnetrons 25 are placed.

Figure 6B:
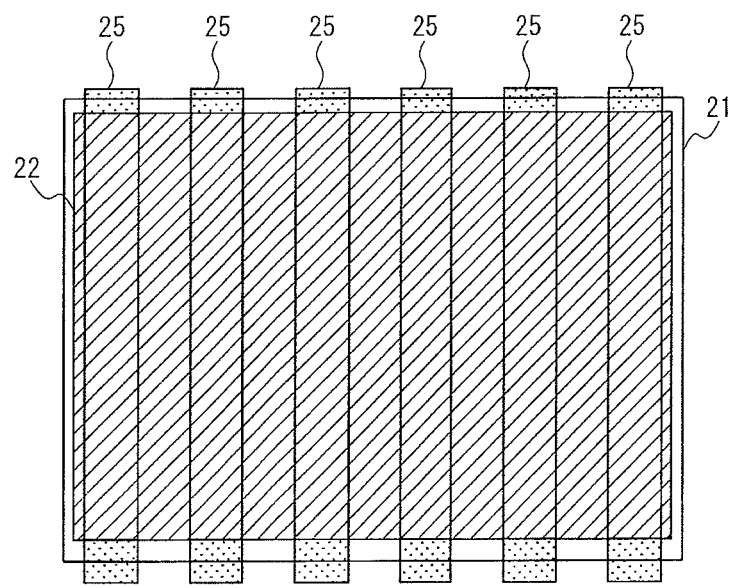

FIG. 6B schematically shows the placement relationship among the substrate 21, the target member 22, and the magnetrons 25. The magnetrons 25 are placed facing the substrate 21 at regular intervals, as shown in FIG. 6B.

Figure 6C:
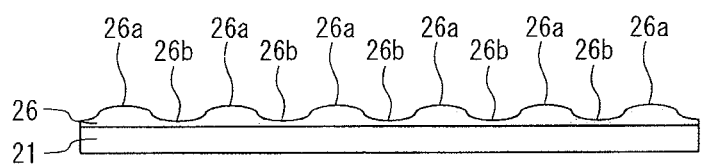

FIG. 6C schematically shows a functional layer 26 formed on the substrate 21. The functional layer 26 is formed by the magnetron sputtering device on which the magnetrons 25 are placed such as shown in FIG. 6B.

As shown in FIG. 6B and FIG. 6C, the thickness of a part 26a of the functional layer 26 corresponding in position to a part of the magnetron sputtering device on which the magnetron 25 is placed is greater than the thickness of a part of the functional layer 26 corresponding in position to a part of the magnetron sputtering device on which no magnetron 25 is placed. That is, the functional layer 26 has an uneven thickness due to the respective placement positions of the magnetrons 25.

In the light of this, the following describes difference between the case where two magnetron sputtering devices have the respective same placement positions of magnetrons and the case where the two magnetron sputtering devices differ in respective placement positions of magnetrons from each other.

<Case where Two Magnetron Sputtering Devices have Respective Same Placement Positions of Magnetrons>

Firstly, the case is described case where the two magnetron sputtering devices have respective same placement positions of magnetrons.

As the film forming system, an in-line film forming system is used here. The film forming system includes a first magnetron sputtering device as a first film forming device for forming a transparent conductive layer and a second magnetron sputtering device as a second film forming device for forming a hole injection layer.

FIG. 7A schematically shows the placement relationship among a substrate 31, a target member 32, and a plurality of magnetrons 35 in the case where the first magnetron sputtering device is used. FIG. 7B schematically shows a transparent conductive layer 36 formed on the substrate 31 by the first magnetron sputtering device.

FIG. 7C schematically shows the placement relationship among a substrate 41, a target member 42, and a plurality of magnetrons 45 in the case where a second magnetron sputtering device is used. FIG. 7D schematically shows a hole injection layer 46 formed on the substrate 41 by the second magnetron sputtering device.

FIG. 7A and FIG. 7C correspond to FIG. 6B, and FIG. 7B and FIG. 7D correspond to FIG. 6C. That is, the first magnetron sputtering device and the second magnetron sputtering device have the respective same placement positions of the magnetrons. Accordingly, the respective transparent conductive layers 36 and the hole injection layers 46, which are formed by the first magnetron sputtering device and the second magnetron sputtering device, have the respective same thickness distributions.

Accordingly, as shown in FIG. 7B, FIG. 7D, and FIG. 7E, a difference th3 between the thickest part and the thinnest part of a multilayered film 56 including the transparent conductive layer 36 and the hole injection layer 46 is greater than both a difference th1 between the thickest part and the thinnest part of the transparent conductive layer 36 and a difference th2 between the thickest part and the thinnest part of the hole injection layer 46. This increases an uneven luminance of the display panel.

<Case where Two Magnetron Sputtering Devices Differ in Respective Placement Positions of Magnetrons from Each Other>

Next, the case is described where the two magnetron sputtering devices differ in respective placement positions of magnetrons from each other.

FIG. 8A schematically shows the placement relationship among a substrate 61, a target member 62, and a plurality of magnetrons 65 in the case where the first magnetron sputtering device is used. FIG. 8B schematically shows a transparent conductive layer 66 formed on the substrate 61 by the first magnetron sputtering device.

FIG. 8C schematically shows the placement relationship among a substrate 71, a target member 72, and a plurality of magnetrons 75 in the case where the second magnetron sputtering device is used. FIG. 8D schematically shows a hole injection layer 76 formed on the substrate 71 by the second magnetron sputtering device.

Comparison of FIG. 8A and FIG. 8C shows that respective t positions of the magnetrons 65 placed on the target member 62 differ from positions of the magnetrons 75 placed on the target member 72. The following gives specific description. The respective placement positions of the magnetrons shown in FIG. 8A and FIG. 8C are in common that the magnetrons are equally spaced. However, in FIG. 8C, a magnetron is placed on a region corresponding in position to an interval between each two adjacent magnetrons shown in FIG. 8A. That is, the respective placement positions of the magnetrons shown in FIG. 8A and FIG. 8C differ from each other by half a cycle. As a result, there occurs difference in magnetic field distribution in the periphery of the target member facing the substrate differs between the placement relationship shown in FIG. 8A and the placement relationship shown in FIG. 8C. This results in difference in the respective thickness distribution between the transparent conductive layers 66 and the hole injection layers 76 formed by the first magnetron sputtering device and the magnetron sputtering device, respectively. Specifically, as clear from the comparison of FIG. 8B and FIG. 8D, while thick parts 66a of the transparent conductive layer 66 correspond one-to-one in position to thin parts 76a of the hole injection layer 76, thin parts 66b of the transparent conductive layer 66 correspond one-to-one in position to thick parts 76b of the hole injection layer 76.

Accordingly, in the case where the transparent conductive layer 66 and the hole injection layer 76 are layered to form a multilayered film 86, a difference th4 between the thickest part and the thinnest part of the multilayered film 86 shown in FIG. 8E is smaller than the difference th3 between the thickest part and the thinnest part of the multilayered film 56 shown in FIG. 7E. In other words, the transparent conductive layer 66 and the hole injection layer 76 are formed by the two magnetron sputtering devices, respectively, which differ in placement positions of magnetrons. This results in the multilayered film 86 with an improved uneven thickness. Especially in the above case, the respective positions of the magnetrons placed on the two magnetron sputtering devices differ from each other by half a cycle. Accordingly, the thinnest part of the hole injection layer 76 is layered on the thickest part of the transparent conductive layer 66, and the thickest part of the hole injection layer 76 is layered on the thinnest part of the transparent conductive layer 66. This minimizes the uneven thickness of the multilayered film 86.

Note that the hole injection layer 76 for example has an average thickness that is approximately equivalent to the difference in thickness between the thickest part and the thinnest part of the transparent conductive layer 66. This is in order to improve the uneven thickness of the multilayered film 86. Also, even in the case where the thickness of the hole injection layer 76 is remarkably smaller than the thickness of the transparent conductive layer 66, it is possible to improve the uneven thickness of the multilayered film 86. This is because that thickness distribution occurs in the hole injection layer 76 irrespective of the thickness thereof As described above, the uneven thickness of the multilayered film 86 is improved, thereby improving the uneven luminance of the display panel 105.

<Manufacturing Method>

Next, a manufacturing process of the display panel 105 is exemplified. FIG. 9A, FIG. 9B and FIG. 10A to FIG. 10C show an example of the manufacturing process of the display panel 105. In FIG. 9A, FIG. 9B and FIG. 10A to FIG. 10C, only part of the display panel 105 is schematically shown.

Firstly, an Ag thin film is formed on an interlayer insulating film 2 formed on the TFT substrate 1. The Ag thin film is formed by a vacuum film forming method such as a magnetron sputtering method and a vacuum deposition method.

Next, an ITO thin film is formed on the Ag thin film. The ITO thin film has a thickness of 10 to 50 nm for example. The ITO thin film is formed by a vacuum film forming method such as the magnetron sputtering method and the vacuum deposition method. For example, the first magnetron sputtering device shown in FIG. 8A may be employed.

After formation of the Ag thin film and the ITO thin film, patterning is performed by photolithography to form anodes 3 and transparent conductive layers 4 in rows and columns (FIG. 9A).

On the surface of the TFT substrate 1 on which the anodes 3 and the transparent conductive layers 4 are formed in rows and columns, a hole injection layer 5 containing WOx, MoOx, or MoxWyOz is formed from WOx or a composition containing MoxWyOz (FIG. 9B). The hole injection layer 5 has a thickness of 5 to 40 nm for example. The hole injection layer 5 is formed by a vacuum film forming method such as the magnetron sputtering method and the vacuum deposition method. For example, the second magnetron sputtering device shown in FIG. 8C may be employed.

Figure 10A:
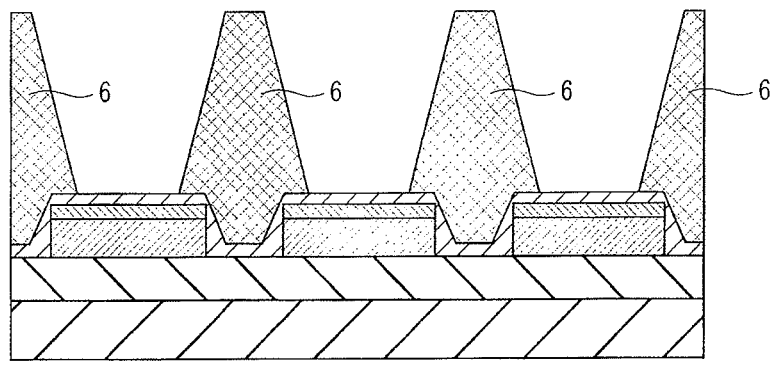
FIG. 10A to FIG. 10C show an example of a manufacturing process of the display panel 105 subsequent to the manufacturing process shown in FIG. 9A and FIG. 9B.

Next, on the hole injection layer 5, a bank material layer composed of an insulating organic material is formed by applying or the like. Then, on the bank material layer, a mask having an opening with a predetermined shape is overlaid. The bank material layer is exposed to light over the mask, and then unnecessary part of the bank material layer is removed by cleansing using a developer. This completes the patterning on the bank material layer, and as a result banks 6 are formed (FIG. 10A).

In each of regions partitioned by the banks 6, an ink composition containing a material of a hole transport layer is dropped by an inkjet method or the like. The ink composition is dried to form a hole transport layer 7.

Figure 10B:
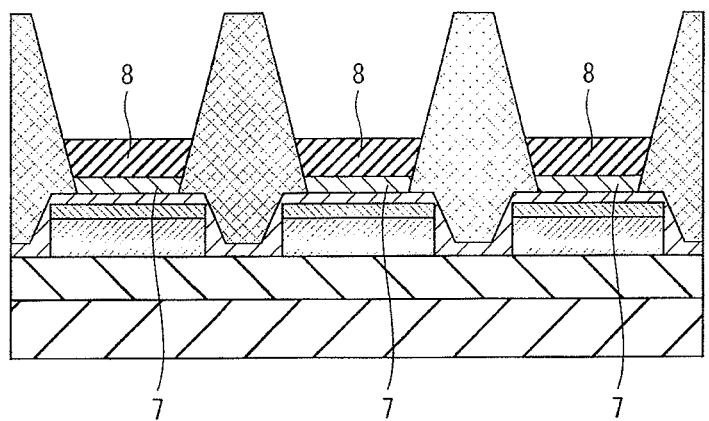

After formation of the hole transport layer 7, in each of the regions partitioned by the banks 6, an ink composition containing a light-emitting material is dropped by the inkjet method or the like. The ink composition is dried to form a light-emitting layer 8 (FIG. 10B).

Note that the hole transport layer 7 and the light-emitting layer 8 each may be formed by a dispenser method, a nozzle-coat method, a spin-coat method, an intaglio printing method, a letterpress printing method, or the like.

Figure 10C:
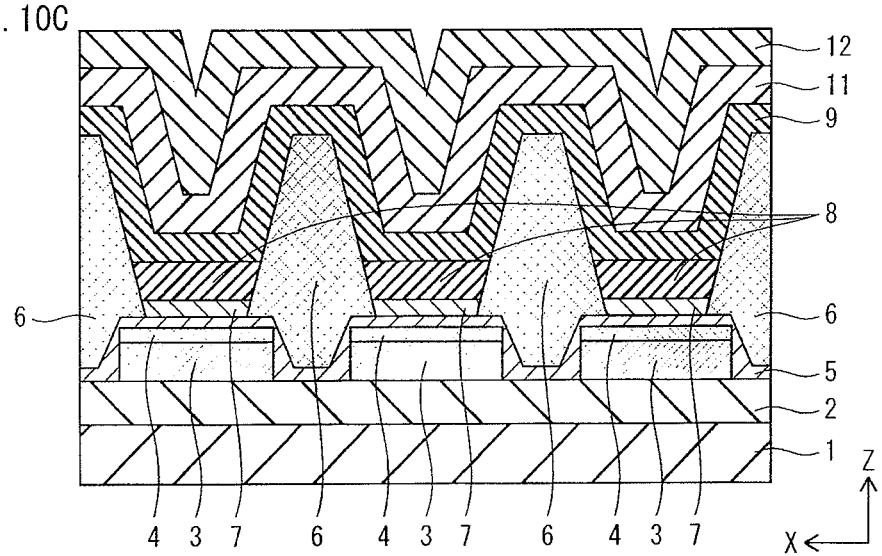

After formation of the light-emitting layer 8, an electron transport layer 9 and a cathode 11 that is an ITO thin film or the like are formed. Then, a passivation layer 12 is formed on the cathode 11 (FIG. 10C). The electron transport layer 9 and the cathode 11 are each formed by a vacuum film forming method such as the magnetron sputtering method and the vacuum deposition method.

According to the display panel 105 relating to the present embodiment as described above, the transparent conductive layer 4 and the hole injection layer 5 differ in thickness distribution from each other. This results in layering of the transparent conductive layer 4 and the hole injection layer 5, such that the thickest part of the transparent conductive layer 4 does not correspond in position to the thickest part of the hole injection layer 5 and the thinnest part of the transparent conductive layer 4 does not correspond in position to the thinnest part of the hole injection layer 5.

This improves the uneven thickness of a multilayered film including the transparent conductive layer 4 and the hole injection layer 5, thereby improving the uneven luminance of the display panel 105.

Modification Examples

Although the light-emitting panel relating to the present invention has been described above based on the embodiment with use of the display panel as an example, the present invention is of course not limited to the above embodiment. The following modification examples may be employed, for example.

(1) The thickness of the hole injection layer may be smaller in the micro region a than in the micro region b, and the thickness of the transparent conductive layer may be greater in the micro region a than in the micro region b.

(2) The above description has been given with use of the transparent conductive layer and the hole injection layer as two layers included in a functional multilayer formed by a magnetron sputtering device. Alternatively, the two layers constituting the functional layer may include an anode, an electron transport layer, a cathode, and so on. Also, the two layers included in the functional multilayer do not necessarily need to be adjacent each other in the layering direction, and may be distant from each other. Note that, in this case, it is necessary not to interpose, between the two layers, any functional layer formed by an applying method such as the inkjet method. This is because the shape of such a functional layer formed by the applying method is not influenced by the shape of a layer formed under the functional layer.

Figure 11:
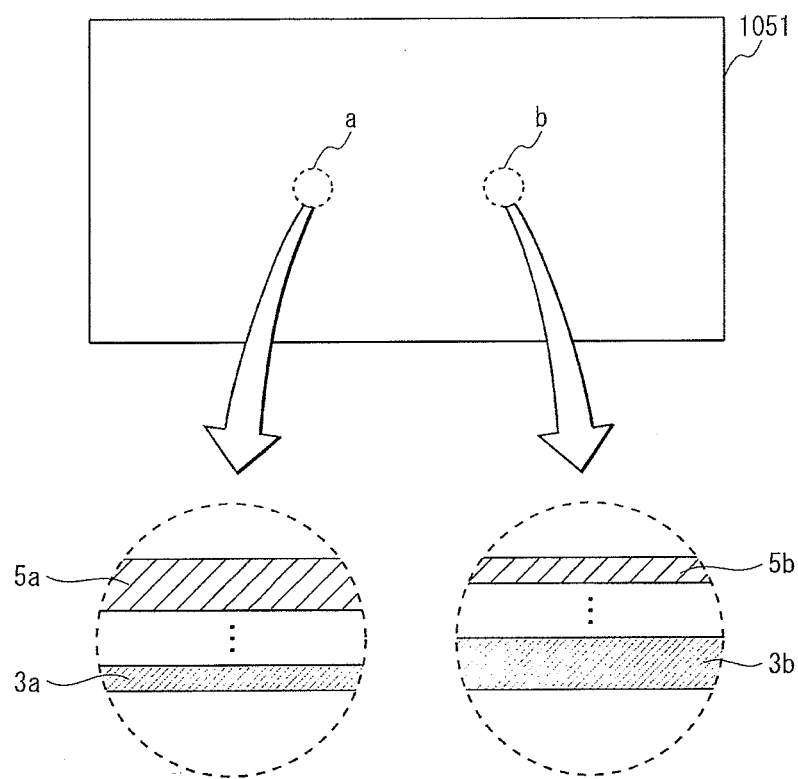
FIG. 11 schematically shows the respective thicknesses of an anode and a hole injection layer in each of micro regions A and B of a display panel 1051.

The following description is given with use of an anode and a hole injection layer as the two layers included in the functional multilayer that are distant from each other. FIG. 11 schematically shows the respective thicknesses of an anode and a hole injection layer in each of a micro regions a and b of a display panel 1051. The display panel 1051 shown in FIG. 11 has the structure in which the thickness of a part 3a of the anode positioned in the micro region a is smaller than the thickness of a part 3b of the anode positioned in the micro region b, the thickness of a part 5a of the hole injection layer positioned in the micro region a is greater than the thickness of a part 5b of the hole injection layer positioned in the micro region b. In this way, even in the case where the two layers included in the functional multilayer are distant from each other, it is possible to improve the uneven thickness of the functional multilayer by forming the two layers with use of respective magnetron sputtering devices that differ in placement positions of magnetrons from each other.

Also, it is unnecessary to limit to the functional multilayer constituted from two layers. The same applies to a functional multilayer constituted from three or more layers. The following description is given with use of a transparent conductive layer, a hole injection layer, and an anode as three functional layers constituting a functional multilayer.

Figure 12:
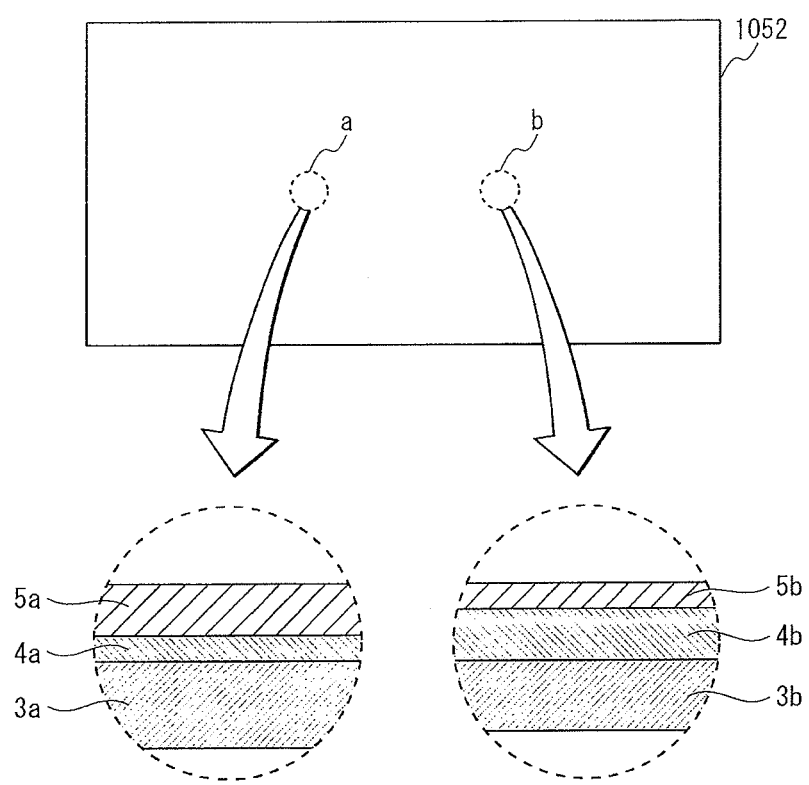
FIG. 12 schematically shows the respective thicknesses of a transparent conductive layer, a hole injection layer, and an anode in each of micro regions a and b of a display panel 1052.

FIG. 12 schematically shows the respective thicknesses of a transparent conductive layer, a hole injection layer, and an anode in each of micro regions a and b of a display panel 1052.

The display panel 1052 shown in FIG. 12 has the structure in which while the thickness of a part 5a of the hole injection layer positioned in the micro region a is greater than the thickness of a part 5b of the hole injection layer positioned in the micro region b, the thickness of a part 4a of the transparent conductive layer positioned in the micro region a is smaller than the thickness of a part 4b of the transparent conductive layer positioned in the micro region b. Furthermore, the thickness of a part 3a of the anode positioned in the micro region a is greater than the thickness of a part 3b of the anode positioned in the micro region b.

Figure 13A:
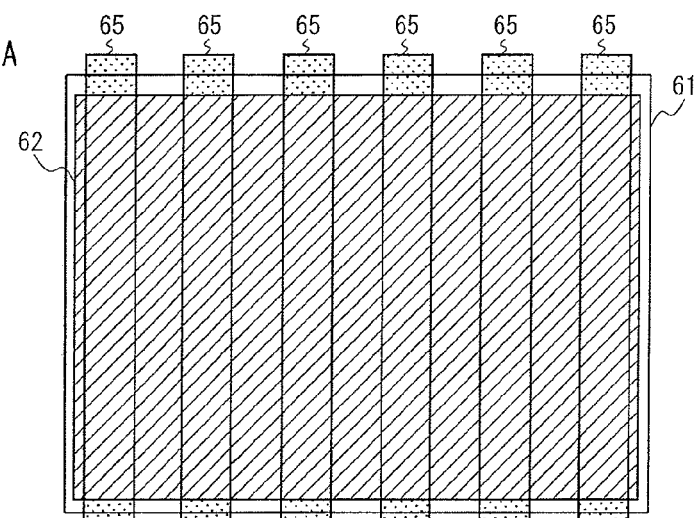
FIG. 13A schematically shows the placement relationship among the substrate 61, the target member 62, and the plurality of magnetrons 65 in the case where the first magnetron sputtering device is used, FIG. 13B schematically shows the placement relationship among the substrate 71, the target member 72, and the plurality of magnetrons 75 in the case where the second magnetron sputtering device is used, and FIG. 13C schematically shows the placement relationship among a substrate 91, a target member 92, and a plurality of magnetrons 95 in the case where a third magnetron sputtering device for film formation of anodes is used.
Figure 13B:
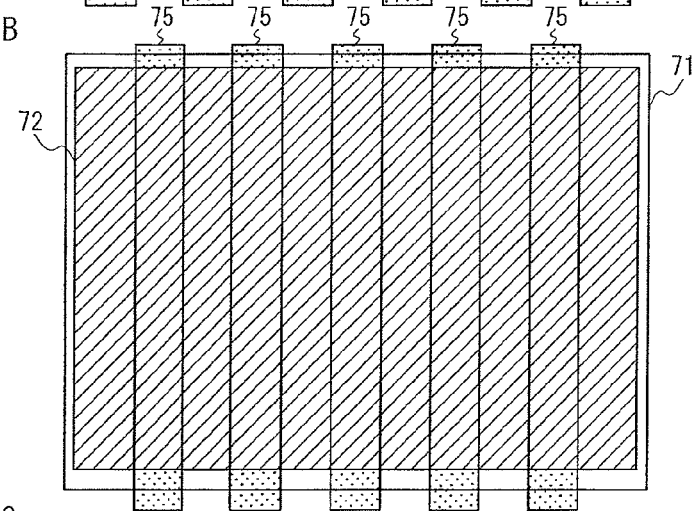
Figure 13C:
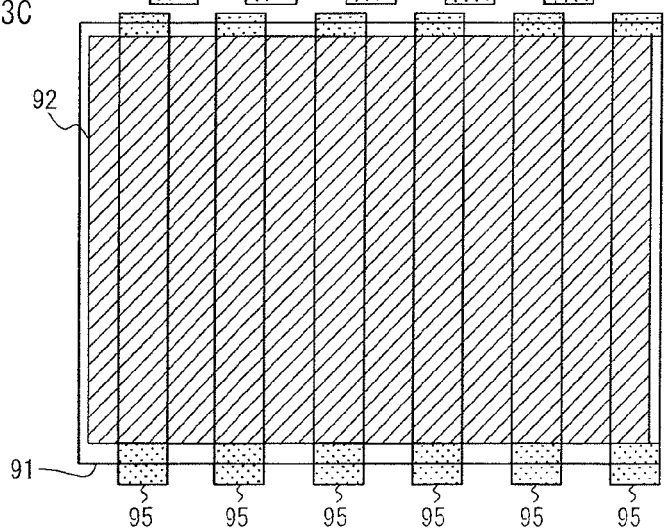

Next, FIG. 13A schematically shows the placement relationship among the substrate 61, the target member 62, and the plurality of magnetrons 65 in the case where the first magnetron sputtering device is used. FIG. 13B schematically shows the placement relationship among the substrate 71, the target member 72, and the plurality of magnetrons 75 in case where the second magnetron sputtering device is used. FIG. 13C schematically shows the placement relationship among a substrate 91, a target member 92, and a plurality of magnetrons 95 in the case where a third magnetron sputtering device for film formation of anodes is used.

FIG. 13A corresponds to FIG. 8A, and FIG. 13B corresponds to FIG. 8C. In other words, the respective placement positions of the magnetrons shown in FIG. 13A and FIG. 13B differ from each other by half a cycle. In FIG. 13B, a magnetron is placed on a region corresponding in position to an interval between each two adjacent magnetrons shown in FIG. 13A.

Also, the respective placement positions of the magnetrons shown in FIG. 13A and FIG. 13C differ from each other by one-fourth cycle. Accordingly, there are differences in respective positions among the magnetrons 95 placed on the target member 92, the magnetrons 65 placed on the target member 62, and the magnetrons 75 placed on the target member 72.

Since the respective placement positions of the magnetrons differ among all the three magnetron sputtering devices, it is possible to improve the uneven thickness of a multilayered film including respective functional layers formed by the these magnetron sputtering devices.

The above description has been given with use of the transparent conductive layer, the hole injection layer, and the anode as the three layers constituting the functional multilayer. Alternatively, other functional layers may be employed.

(3) The hole transport layer and the electron transport layer each have been described as a single layer. Alternatively, the hole transport layer and the electron transport layer each may be constituted from two or more layers. In this case, the thickness distribution may differ for each of the layers constituting the hole transport layer and for each of the layers constituting the electron transport layer. This improves the uneven thickness of a multilayered film including the hole transport layer and the electron transport layer.

(4) In the above embodiment, the magnetrons are placed at regular intervals. However, the magnetrons do not necessarily need to be placed at regular intervals. It is only necessary to place respective magnetrons on the magnetron sputtering devices that are used for forming a plurality of layers constituting a functional multilayer, such that the respective thickest parts of the layers are not layered on each other and the respective thinnest parts of the layers are not layered on each other. In other words, the magnetrons may be placed in any pattern as long as the layers constituting the functional multilayer differ in thickness distribution from each other. For example, the magnetrons may be placed such that an interval between each two adjacent magnetrons gradually increases. Alternatively, the entire magnetrons may be placed obliquely. Also, the magnetrons may be each a circle or a polygon, instead of a rectangle.

(5) The above description has been given with use of the magnetron sputtering device as an example of a vacuum film forming device. Alternatively, an evaporation device, a CVD device, a sputtering device, a plating device, or the like may be employed. The following simple description is given on the case where the evaporation device is employed. The evaporation device for example has the structure in which a plurality of evaporation sources are placed facing a substrate at regular intervals, instead of a plurality of magnetrons. The thickness a functional layer formed by the evaporation device that is positioned in a region corresponding to each of the evaporation sources is greater than the thickness the functional layer that is positioned in a region corresponding to an interval between each two adjacent of the evaporation sources. In other words, the formed functional layer has an uneven thickness due to respective placement positions of the evaporation sources. Therefore, it is possible to improve the uneven thickness of a functional multilayer including the layers formed with use of respective evaporation devices that differ in placement positions of evaporation sources from each other.

(6) The micro regions a and b each have been described as a region composed of a plurality of pixels. Alternatively, the micro regions a and b each may be a region composed of one pixel, or a region smaller than one pixel. Further alternatively, the micro regions a and b each do not necessarily need to be a region on the basis of pixels. Yet alternatively, the micro regions a and b may be adjacent each other in the direction perpendicular to the layering direction of the functional multilayer.

Figure 14:
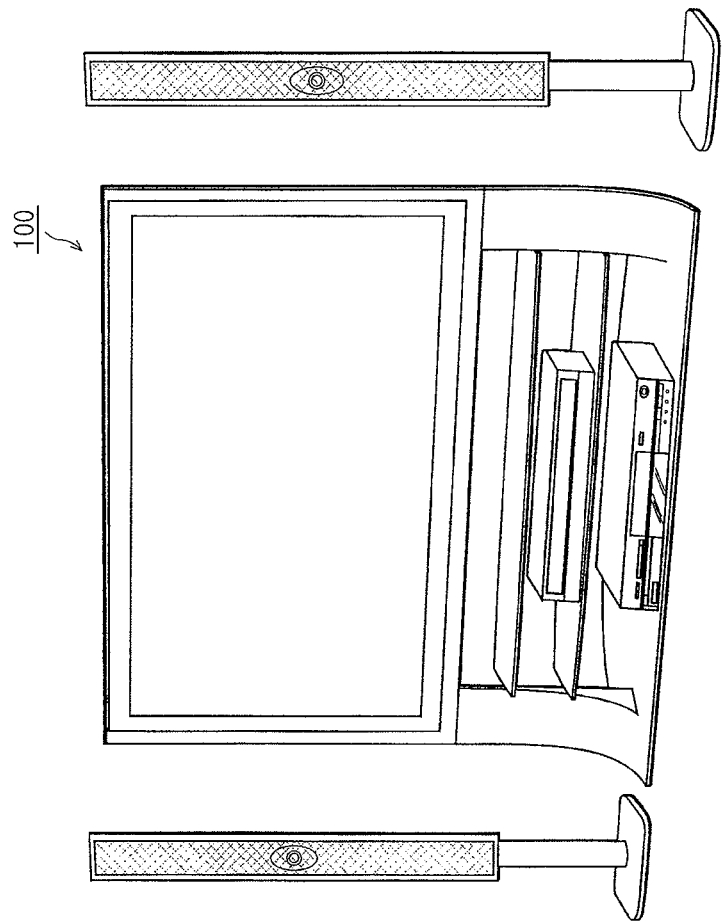
FIG. 14 shows an example of the visual appearance of the display device 100.

(7) The display device 100 has for example a visual appearance such as shown in FIG. 14, though no description on the visual appearance has been given above.

(8) The above description has been given with use of a display panel for display devices as an example of a light-emitting panel. Alternatively, a light-emitting panel for lighting devices may be employed.

(9) The above description has been given on the case where two layers are formed by two magnetron sputtering devices, respectively, with use of the first magnetron sputtering device and the second magnetron sputtering device as the examples of the first film forming device and the second film forming device, respectively. Alternatively, the two layers may be formed by a single magnetron sputtering device.

In this case, by changing, for each layer, respective positions of magnetrons placed on the single magnetron sputtering device for example, it is possible to form a multilayered film including the two layers that differ in thickness distribution from each other.

(10) The first film forming device and the second film forming device may be a first CVD device a second CVD device, respectively. Alternatively, the first film forming device and the second film forming device may be a first evaporation device and a second evaporation device, respectively.

Furthermore, the film forming system may be any combination of two or more of a magnetron sputtering device, an evaporation device, a CVD device, a sputtering device, and a plating device. In the case where of two of these devices is used for the film forming system for example, one of the first film forming device and the second film forming device may be the magnetron sputtering device, and the other may be the evaporation device. Alternatively, one may be the CVD device, and the other may be the evaporation device. Further alternatively, one may be the magnetron sputtering device, and the other may be the CVD device.

INDUSTRIAL APPLICABILITY

The present invention is utilizable for display devices, lighting devices, and the like.

REFERENCE SIGNS LIST 100 display device
101 control circuit
102 memory
103 scanning line drive circuit
104 data line drive circuit
105 display panel
200 gate line
201 data line
202 power line
203 switching transistor
204 drive transistor
205 anode
206 retention volume
207 cathode
208 pixel circuit
209 drive part
1 TFT substrate
2 interlayer insulating film
3 anode
4 transparent conductive layer
5 hole injection layer
6 bank
7 hole transport layer
8 light-emitting layer
9 electron transport layer
11 cathode
12 passivation layer

The invention claimed is:

1. A manufacturing method of a light-emitting panel including a substrate and a light-emitting functional multilayer that is formed on the substrate and includes a plurality of functional layers, the manufacturing method comprising:
   forming the first functional layer by a first film forming device; and
   forming the second functional layer by a second film forming device, wherein
      a thickness of part of the first functional layer positioned in a first light-emitting region is smaller than a thickness of part of the first functional layer positioned in a second light-emitting region,
      a thickness of part of the second functional layer positioned in the first light-emitting region is greater than a thickness of part of the second functional layer positioned in the second light-emitting region, and
      when the light-emitting functional multilayer is viewed in a layering direction thereof, the first light-emitting region and the second light-emitting region are adjacent or distant from each other in a direction perpendicular to the layering direction, and each include a plurality of pixels that are each composed of a plurality of adjacent sub-pixels.

2. The manufacturing method of claim 1, wherein
the respective parts of the first functional layer positioned in the first light-emitting region and the second light-emitting region are formed in the forming of the first functional layer, and
the respective parts of the second functional layer positioned in the first light-emitting region and the second light-emitting region are formed in the forming the second functional layer.

3. The manufacturing method of claim 1, wherein
a total optical thickness of the part of the first functional layer and the part of the second functional layer positioned in the first light-emitting region is equal to a total optical thickness of the part of the first functional layer and the part of the second functional layer positioned in the second light-emitting region.

4. The manufacturing method of claim 1, wherein
the first film forming device is a first magnetron sputtering device, and
the second film forming device is a second magnetron sputtering device.

5. The manufacturing method of claim 4, wherein
the first magnetron sputtering device comprises:
a first target member;
a first target member holder that holds the first target member on a first surface thereof; and
a plurality of first magnetrons on a second surface of the first target member holder that is opposite the first surface of the first target member holder,
the second magnetron sputtering device comprises:
a second target member;
a second target member holder that holds the second target member on a first surface thereof; and
a plurality of second magnetrons on a second surface of the second target member holder that is opposite the first surface of the second target member holder,
the substrate is placed facing the first target member in the first magnetron sputtering device, and then the substrate is placed facing the second target member in the second magnetron sputtering device, and
respective positions of the first magnetrons facing the substrate differ from respective positions of the second magnetrons facing the substrate.

6. The manufacturing method of claim 5, wherein
the first magnetrons are equally spaced with a first spacing,
the second magnetrons are equally spaced with a second spacing, and
the first spacing and the second spacing are equal to each other.

7. The manufacturing method of claim 1, wherein
the first functional layer and the second functional layer are adjacent each other in the layering direction.

8. The manufacturing method of claim 1, wherein
the light-emitting functional multilayer further includes a third functional layer,
the manufacturing method further comprises
forming the third functional layer by a third magnetron sputtering device, and
a thickness of part of the third functional layer positioned in the first light-emitting region is greater than a thickness of part of the third functional layer positioned in the second light-emitting region.

9. The manufacturing method of claim 8, wherein the third magnetron sputtering device comprises:
a third target member;
a third target member holder that holds the third target member on a first surface thereof; and
a plurality of third magnetrons on a second surface of the first target member holder that is opposite the first surface of the third target member holder, and
respective positions of the third magnetrons facing the substrate differ from both the respective positions of the first magnetrons facing the substrate and the respective positions of the second magnetrons facing the substrate.

10. The manufacturing method of claim 1, wherein the first film forming device is a first evaporation device, and
the second film forming device is a second evaporation device.

11. The manufacturing method of claim 10, wherein the first evaporation device comprises a plurality of first evaporation sources,
the second evaporation device comprises a plurality of second evaporation sources,
the substrate is facing the first evaporation sources in the first evaporation device, and then the substrate is placed facing the second evaporation sources in the second evaporation, and
respective positions of the first evaporation sources facing the substrate differ from respective positions of the second evaporation sources facing the substrate.

12. The manufacturing method of claim 11, wherein the first evaporation sources are equally spaced with a first spacing,
the second evaporation sources are equally spaced with a second spacing, and
the first spacing and the second spacing are equal to each other.

13. The manufacturing method of claim 10, wherein the first functional layer and the second functional layer are adjacent each other in the layering direction.

14. The manufacturing method of claim 10, wherein the light-emitting functional multilayer further includes a third functional layer,
the manufacturing method further comprises
forming the third functional layer by a third evaporation device, and
a thickness of part of the third functional layer positioned in the first light-emitting region is greater than a thickness of part of the third functional layer positioned in the second light-emitting region.

15. The manufacturing method of claim 14, wherein the third evaporation device comprises a plurality of third evaporation sources,
respective positions of the third evaporation sources facing the substrate differ from both the respective positions of the first evaporation sources facing the substrate and the respective positions of the second evaporation sources facing the substrate.

* * * * *